(12) United States Patent
Quisenberry

(10) Patent No.: US 9,877,409 B2
(45) Date of Patent: Jan. 23, 2018

(54) METHOD FOR AUTOMOTIVE BATTERY COOLING

(71) Applicant: ThermoTek, Inc., Flower Mound, TX (US)

(72) Inventor: Tony Quisenberry, Highland Village, TX (US)

(73) Assignee: ThermoTek, Inc., Flower Mound, TX (US)

( * ) Notice: Subject to any disclaimer, the term of this patent is extended or adjusted under 35 U.S.C. 154(b) by 264 days.

(21) Appl. No.: 14/799,926

(22) Filed: Jul. 15, 2015

(65) Prior Publication Data

US 2015/0318588 A1   Nov. 5, 2015

Related U.S. Application Data

(63) Continuation of application No. 13/294,538, filed on Nov. 11, 2011, now Pat. No. 9,113,577, and a
(Continued)

(51) Int. Cl.
*F28D 15/00* (2006.01)
*H05K 7/20* (2006.01)
(Continued)

(52) U.S. Cl.
CPC ...... *H05K 7/20336* (2013.01); *B60L 11/1879* (2013.01); *F28D 15/0233* (2013.01);
(Continued)

(58) Field of Classification Search
CPC .......... H05K 7/20336; H01M 10/5004; H01M 10/5016; H01M 10/5048; H01M 10/5059;
(Continued)

(56) References Cited

U.S. PATENT DOCUMENTS 3,528,494 A   9/1970   Levedahl
3,834,171 A   9/1974   Johansson
(Continued)

FOREIGN PATENT DOCUMENTS

DE   1284506   12/1968
DE   3117758   1/1982
(Continued)

OTHER PUBLICATIONS

U.S. Appl. No. 10/998,198, filed Nov. 26, 2004, Quisenberry et al.
(Continued)

*Primary Examiner* — Ljiljana Ciric
(74) *Attorney, Agent, or Firm* — Winstead PC

(57) ABSTRACT

A battery-cooling system includes a battery array and a plurality of heat pipes that each include a low-profile extrusion having a plurality of hollow tubes formed therein. A heat transfer fluid is disposed in the plurality of hollow tubes. Each heat pipe includes an evaporator portion and a condenser portion. The evaporator portion is disposed between successive batteries within the battery array and the condenser portion is disposed outside of the battery array and exposed to a heat sink.

11 Claims, 6 Drawing Sheets

Related U.S. Application Data continuation-in-part of application No. 12/857,635, filed on Aug. 17, 2010, now Pat. No. 8,621,875, which is a continuation of application No. 10/998,199, filed on Nov. 26, 2004, now Pat. No. 7,857,037, which is a continuation-in-part of application No. 10/305,662, filed on Nov. 26, 2002, now Pat. No. 6,834,712.

(60) Provisional application No. 61/412,817, filed on Nov. 12, 2010, provisional application No. 60/334,235, filed on Nov. 27, 2001.

(51) Int. Cl.
  *H01M 10/66* (2014.01)
  *B60L 11/18* (2006.01)
  *F28D 15/02* (2006.01)
  *H01M 10/625* (2014.01)
  *H01M 10/6569* (2014.01)
  *H01M 10/6557* (2014.01)
  *H01M 10/6552* (2014.01)
  *H01M 10/613* (2014.01)
  *H01M 10/617* (2014.01)
  *H01M 10/6561* (2014.01)
  *B60K 1/00* (2006.01)

(52) U.S. Cl.
  CPC ...... *F28D 15/0275* (2013.01); *H01M 10/613* (2015.04); *H01M 10/617* (2015.04); *H01M 10/625* (2015.04); *H01M 10/6552* (2015.04); *H01M 10/6557* (2015.04); *H01M 10/6561* (2015.04); *H01M 10/6569* (2015.04); *H01M 10/66* (2015.04); *B60K 2001/003* (2013.01); *H01M 2220/20* (2013.01); *Y02T 10/705* (2013.01); *Y02T 10/7005* (2013.01); *Y02T 10/7011* (2013.01)

(58) Field of Classification Search
  CPC ............ H01M 10/5079; B60L 11/1879; F28D 15/0233; F28D 15/0275; B60K 2001/003; Y02T 10/7005; Y02T 10/7011; Y02T 10/705
  USPC ....... 165/104.26, 104.33; 429/433, 434, 435, 429/436, 437, 438, 439
  See application file for complete search history.

(56) References Cited

U.S. PATENT DOCUMENTS

| | | |
|---|---|---|
| 3,875,926 A | 4/1975 | Frank |
| 4,036,290 A | 7/1977 | Kelly |
| 4,072,188 A | 2/1978 | Wilson et al. |
| 4,125,122 A | 11/1978 | Stachurski |
| 4,180,127 A | 12/1979 | Maxson |
| 4,196,504 A | 4/1980 | Eastman |
| 4,245,380 A | 1/1981 | Maxson |
| 4,279,294 A | 7/1981 | Fitzpatrick et al. |
| 4,280,519 A | 7/1981 | Chapman |
| 4,345,642 A | 8/1982 | Ernst et al. |
| 4,353,415 A | 10/1982 | Klaschka et al. |
| 4,375,157 A | 3/1983 | Boesen |
| 4,381,032 A | 4/1983 | Cutchaw |
| 4,438,759 A | 3/1984 | Kitajima et al. |
| 4,448,028 A | 5/1984 | Chao et al. |
| 4,470,450 A | 9/1984 | Bizzell et al. |
| 4,493,308 A | 1/1985 | Hurley et al. |
| 4,503,906 A | 3/1985 | Andres et al. |
| 4,513,732 A | 4/1985 | Feldman, Jr. |
| 4,550,774 A | 11/1985 | Andres et al. |
| 4,558,395 A | 12/1985 | Yamada et al. |
| 4,562,955 A | 1/1986 | Horster et al. |
| 4,621,681 A | 11/1986 | Grover |
| 4,640,347 A | 2/1987 | Grover et al. |
| 4,675,783 A | 6/1987 | Murase |
| 4,686,961 A | 8/1987 | Garrison |
| 4,706,739 A | 11/1987 | Noren |
| 4,729,060 A | 3/1988 | Yamamoto et al. |
| 4,770,238 A | 9/1988 | Owen |
| 4,802,929 A | 2/1989 | Schock |
| 4,830,100 A | 5/1989 | Kato et al. |
| 4,854,377 A | 8/1989 | Komoto et al. |
| 4,880,052 A | 11/1989 | Meyer, IV et al. |
| 4,880,053 A | 11/1989 | Sheyman |
| 4,884,630 A | 12/1989 | Nelson et al. |
| 4,896,716 A | 1/1990 | Sotani et al. |
| 4,899,810 A | 2/1990 | Fredley |
| 4,909,315 A | 3/1990 | Nelson et al. |
| 4,921,041 A | 5/1990 | Akachi |
| 4,982,274 A | 1/1991 | Murase et al. |
| 5,002,122 A | 3/1991 | Sarraf et al. |
| 5,005,640 A | 4/1991 | Lapinski et al. |
| 5,029,389 A | 7/1991 | Tanzer |
| 5,036,384 A | 7/1991 | Umezawa |
| 5,038,569 A | 8/1991 | Shirota et al. |
| 5,044,429 A | 9/1991 | Sakaya et al. |
| 5,054,296 A | 10/1991 | Sotani et al. |
| 5,069,274 A | 12/1991 | Haslett et al. |
| 5,076,351 A | 12/1991 | Munekawa et al. |
| 5,084,966 A | 2/1992 | Murase |
| 5,099,311 A | 3/1992 | Bonde et al. |
| 5,103,897 A | 4/1992 | Cullimore et al. |
| 5,117,901 A | 6/1992 | Cullimore |
| 5,133,492 A | 7/1992 | Wohrstein et al. |
| 5,139,546 A | 8/1992 | Novobilski |
| 5,159,529 A | 10/1992 | Lovgren et al. |
| 5,168,921 A | 12/1992 | Meyer, IV |
| 5,179,043 A | 1/1993 | Weichold et al. |
| 5,186,252 A | 2/1993 | Nishizawa et al. |
| 5,199,487 A | 4/1993 | DiFrancesco et al. |
| 5,203,399 A | 4/1993 | Koizumi |
| 5,207,674 A | 5/1993 | Hamilton |
| 5,219,020 A | 6/1993 | Akachi |
| 5,220,171 A | 6/1993 | Hara et al. |
| 5,268,812 A | 12/1993 | Conte |
| 5,283,464 A | 2/1994 | Murase |
| 5,283,715 A | 2/1994 | Carlsten et al. |
| 5,285,347 A | 2/1994 | Fox et al. |
| 5,314,010 A | 5/1994 | Sakaya et al. |
| 5,316,077 A | 5/1994 | Reichard |
| 5,336,128 A | 8/1994 | Birdsong |
| 5,342,189 A | 8/1994 | Inamura et al. |
| 5,353,639 A | 10/1994 | Brookins et al. |
| 5,355,942 A | 10/1994 | Conte |
| 5,383,340 A | 1/1995 | Larson et al. |
| 5,388,635 A | 2/1995 | Gruber et al. |
| 5,404,938 A | 4/1995 | Dinh |
| 5,409,055 A | 4/1995 | Tanaka et al. |
| 5,465,780 A | 11/1995 | Muntner et al. |
| 5,465,782 A | 11/1995 | Sun et al. |
| 5,535,816 A | 7/1996 | Ishida |
| 5,544,698 A | 8/1996 | Paulman |
| 5,555,622 A | 9/1996 | Yamamoto et al. |
| 5,567,493 A | 10/1996 | Imai et al. |
| 5,579,830 A | 12/1996 | Giammaruti |
| 5,598,632 A | 2/1997 | Camarda et al. |
| 5,615,086 A | 3/1997 | Collins et al. |
| 5,636,684 A | 6/1997 | Teytu et al. |
| 5,642,775 A | 7/1997 | Akachi |
| 5,647,429 A | 7/1997 | Oktay et al. |
| 5,647,430 A | 7/1997 | Tajima |
| 5,651,414 A | 7/1997 | Suzuki et al. |
| 5,653,111 A | 8/1997 | Attey et al. |
| 5,655,598 A | 8/1997 | Garriss et al. |
| 5,660,229 A | 8/1997 | Lee et al. |
| 5,666,819 A | 9/1997 | Rockenfeller et al. |
| 5,675,473 A | 10/1997 | McDunn et al. |
| 5,682,748 A | 11/1997 | DeVilbiss et al. |
| 5,689,957 A | 11/1997 | DeVilbiss et al. |
| 5,690,849 A | 11/1997 | DeVilbiss et al. |
| 5,692,558 A | 12/1997 | Hamilton et al. |

(56) References Cited

U.S. PATENT DOCUMENTS

| | | | |
|---|---|---|---|
| 5,697,428 A | 12/1997 | Akachi | |
| 5,711,155 A | 1/1998 | DeVilbiss et al. | |
| 5,727,619 A | 3/1998 | Yao et al. | |
| 5,729,995 A | 3/1998 | Tajima | |
| 5,731,954 A | 3/1998 | Cheon | |
| 5,737,186 A | 4/1998 | Fuesser et al. | |
| 5,785,088 A | 7/1998 | Pai | |
| 5,816,313 A | 10/1998 | Baker | |
| 5,890,371 A | 4/1999 | Rajasubramanian et al. | |
| 5,896,917 A | 4/1999 | Lemont et al. | |
| 5,901,037 A | 5/1999 | Hamilton et al. | |
| 5,901,040 A | 5/1999 | Cromwell et al. | |
| 5,960,866 A | 10/1999 | Kimura et al. | |
| 5,989,285 A | 11/1999 | DeVilbiss et al. | |
| 6,026,890 A | 2/2000 | Akachi | |
| 6,032,726 A | 3/2000 | Wright et al. | |
| 6,041,850 A | 3/2000 | Esser et al. | |
| 6,058,712 A | 5/2000 | Rajasubramanian et al. | |
| 6,072,697 A | 6/2000 | Garcia-Ortiz | |
| 6,101,715 A | 8/2000 | Fuesser et al. | |
| 6,148,906 A | 11/2000 | Li et al. | |
| 6,293,333 B1 | 9/2001 | Ponnappan et al. | |
| 6,302,192 B1 | 10/2001 | Dussinger et al. | |
| 6,315,033 B1 | 11/2001 | Li | |
| 6,394,175 B1 | 5/2002 | Chen et al. | |
| 6,397,935 B1 | 6/2002 | Yamamoto et al. | |
| 6,415,612 B1 | 7/2002 | Pokharna et al. | |
| 6,439,298 B1 | 8/2002 | Li | |
| 6,457,515 B1 | 10/2002 | Vafai et al. | |
| 6,462,949 B1 | 10/2002 | Parish, IV et al. | |
| 6,523,259 B1 | 2/2003 | Pinneo | |
| 6,647,625 B2 | 11/2003 | Wang et al. | |
| 6,672,373 B2 | 1/2004 | Smyrnov | |
| 6,679,316 B1 | 1/2004 | Lin et al. | |
| 6,698,502 B1 | 3/2004 | Lee | |
| 6,705,089 B2 | 3/2004 | Chu et al. | |
| 6,725,668 B1 | 4/2004 | Cornwall | |
| 6,745,825 B1 | 6/2004 | Nakamura et al. | |
| 6,766,817 B2 | 7/2004 | da Silva | |
| 6,795,310 B2 | 9/2004 | Ghosh | |
| 6,810,946 B2 | 11/2004 | Hoang | |
| 6,820,684 B1 | 11/2004 | Chu et al. | |
| 6,828,675 B2 | 12/2004 | Memory et al. | |
| 6,834,712 B2 | 12/2004 | Parish et al. | |
| 6,843,308 B1 | 1/2005 | Duval | |
| 6,918,404 B2 | 7/2005 | da Silva | |
| 6,935,409 B1 | 8/2005 | Parish, IV et al. | |
| 6,948,321 B2 | 9/2005 | Bell | |
| 7,066,586 B2 | 6/2006 | da Silva | |
| 7,150,312 B2 | 12/2006 | Parish, IV et al. | |
| 7,285,255 B2 | 10/2007 | Kadlec et al. | |
| 7,322,402 B2 | 1/2008 | Hsu | |
| 7,331,185 B2 | 2/2008 | Lee et al. | |
| 7,340,904 B2 | 3/2008 | Sauciuc et al. | |
| 7,455,101 B2 | 11/2008 | Hsu | |
| 7,549,461 B2 | 6/2009 | Kroliczek et al. | |
| 8,375,728 B2 | 2/2013 | Bell | |
| 9,496,589 B2 * | 11/2016 | Kopra | |
| 2002/0038550 A1 | 4/2002 | Gillen | |
| 2002/0189793 A1 | 12/2002 | Noda et al. | |
| 2003/0089486 A1 | 5/2003 | Parish et al. | |
| 2003/0089487 A1 | 5/2003 | Parish, IV et al. | |
| 2003/0127215 A1 | 7/2003 | Parish, IV et al. | |
| 2004/0099407 A1 | 5/2004 | Parish, IV et al. | |
| 2004/0112572 A1 | 6/2004 | Moon et al. | |
| 2004/0177947 A1 | 9/2004 | Krassowski et al. | |
| 2005/0006061 A1 | 1/2005 | Quisenberry et al. | |
| 2005/0039887 A1 | 2/2005 | Parish, IV et al. | |
| 2005/0056403 A1 | 3/2005 | Norlin et al. | |
| 2006/0048519 A1 | 3/2006 | Childress | |
| 2006/0090474 A1 | 5/2006 | Sauciuc et al. | |
| 2006/0137181 A1 | 6/2006 | Parish et al. | |
| 2008/0006037 A1 | 1/2008 | Scott et al. | |
| 2008/0015531 A1 | 1/2008 | Hird et al. | |
| 2008/0047736 A1 | 2/2008 | Levine | |
| 2008/0110597 A1 | 5/2008 | Parish et al. | |
| 2009/0007572 A1 | 1/2009 | Bell | |
| 2009/0154105 A1 | 6/2009 | Chu | |
| 2011/0162389 A1 | 7/2011 | Bell | |
| 2011/0203777 A1 | 8/2011 | Zhao et al. | |
| 2012/0111028 A1 | 5/2012 | Campbell et al. | |
| 2016/0111761 A1 * | 4/2016 | Kopra | H01M 2/1077 429/120 |

FOREIGN PATENT DOCUMENTS

| | | |
|---|---|---|
| DE | 8512617 | 9/1985 |
| DE | 19849919 | 5/1999 |
| EP | 0969354 A2 | 1/2000 |
| GB | 334209 | 8/1930 |
| GB | 1402509 | 8/1975 |
| GB | 2128319 A | 4/1984 |
| GB | 2128320 A | 4/1984 |
| GB | 2293446 | 3/1996 |
| JP | 53136749 | 11/1978 |
| JP | 63115351 | 5/1988 |
| JP | 06291481 | 10/1994 |
| JP | 2001-223308 | 8/2001 |
| JP | 2002-206881 | 7/2002 |
| SU | 589531 | 1/1978 |
| SU | 1476297 | 4/1989 |
| WO | WO-91/06958 | 5/1991 |
| WO | WO-95/26125 | 9/1995 |
| WO | WO-98/20260 | 1/1998 |
| WO | WO-99/42781 A1 | 8/1999 |
| WO | WO-00/70288 | 11/2000 |
| WO | WO-01/03484 | 1/2001 |
| WO | WO-02/080270 A1 | 10/2002 |
| WO | WO-03/046463 A2 | 6/2003 |

OTHER PUBLICATIONS

U.S. Appl. No. 10/998,199, filed Nov. 26, 2004, Parish, IV et al.
U.S. Appl. No. 12/871,583, Devilbiss et al.
U.S. Appl. No. 12/857,635, Parish et al.
Andre Ali et al.; "Advanced Heat Pipe Thermal Solutions for Higher Power Notebook Computers"; Intel Corporation, Santa Clara, CA 1999; Thermacore, Inc. Lancaster, PA 1999; 6 pages.
Thermalex, Inc. Brochure, "Setting a Higher Standard in Aluminum Extrusions", 2758 Gunter Park Drive West, Montgomery, AL, no date; 8 pages.
"Furukawa Electric Heat Planar"; Brochure undated from Trade Show, Aug. 1999; 4 pages.
"Gore's Polarchip Thermal Interface Materials . . . Bridge the Gap Between Hot PCBs and Cool Heat Sinks."; W.L. Gore and Associates, Inc. 2000; 1 page.
"Thermal Management Components to Fill Virtually Any Gap Configuration"; Stockwell Rubber Company; Nov. 2001.
"Furukawa Electric Heat Planar"; undated material from Aug. 1999 trade show marketed by Furu Kawa Electric North America, Inc.
Cornelia Dean, "When Questions of Science Come to a Courtroom, Truth has Many Faces," The New York Times (Dec. 8, 2006).
Elson Silva, PhD, "Letter from Elson Silva, PhD, for IDS," May 16, 2008. (9 pages).
Thomas, Shane, International Search Report for PCT/US15/16837, May 22, 2015 [2 pages].

* cited by examiner

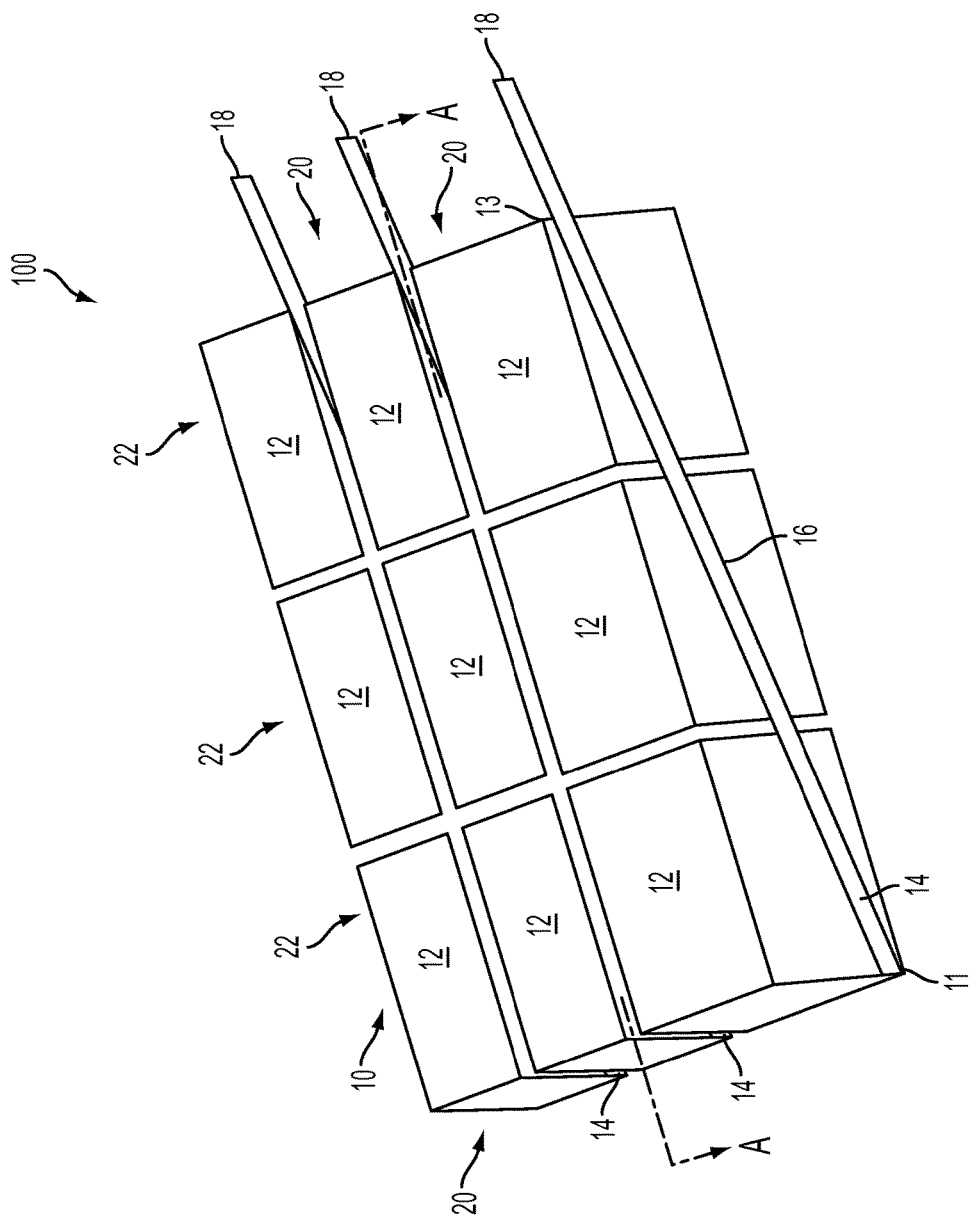

METHOD FOR AUTOMOTIVE BATTERY COOLING

CROSS-REFERENCE TO RELATED APPLICATIONS

This application is a continuation of U.S. patent application Ser. No. 13/294,538, filed on Nov. 11, 2011. U.S. patent application Ser. No. 13/294,538 is a Continuation-in-Part of U.S. patent application Ser. No. 12/857,635, filed Aug. 17, 2010. U.S. patent application Ser. No. 12/857,635 is a Continuation of U.S. patent application Ser. No. 10/998,199 (now U.S. Pat. No. 7,857,037), filed Nov. 26, 2004. U.S. patent application Ser. No. 10/998,199 is a Continuation-in-Part of U.S. patent application Ser. No. 10/305,662 (now U.S. Pat. No. 6,834,712), filed Nov. 26, 2002. U.S. patent application Ser. No. 10/305,662 claims priority to U.S. Provisional Patent Application No. 60/334,235 filed Nov. 27, 2001. U.S. patent application Ser. No. 13/294,538 claims priority to U.S. Provisional Patent Application No. 61/412,817, filed Nov. 12, 2010. U.S. patent application Ser. No. 12/857,635, U.S. patent application Ser. No. 10/998,199, U.S. patent application Ser. No. 10/305,662, U.S. patent application Ser. No. 12/871,583, U.S. patent application Ser. No. 11/336,698, U.S. patent application Ser. No. 10/328,537, U.S. patent application Ser. No. 09/328,183, U.S. patent application Ser. No. 08/327,329, U.S. Provisional Patent Application No. 60/525,242, U.S. Provisional Patent Application No. 60/334,235, U.S. Provisional Patent Application No. 61/412,817, and U.S. Provisional Patent Application No. 60/088,428 are each incorporated herein by reference.

BACKGROUND

Field of the Invention

The present application relates generally to battery cooling systems and more particularly, but not by way of limitation, to battery cooling systems incorporating heat pipes constructed with low-profile extrusions adapted for select heat exchange and designed for use with a battery array.

History of the Related Art

Dependence on non-renewable carbon-based energy sources, such as, for example, oil, gas, coal, and the like has led to intense focus on development of alternative energy sources. Moreover, detrimental environmental effects believed to be associated with carbon-based fuels have contributed to an urgency with which alternative energy sources are developed.

Chief among alternative energy initiatives is development of alternatively-fueled vehicles. In the United States alone, each passenger vehicle is estimated to release in excess of approximately 11,000 pounds of carbon dioxide along with smaller amounts of various other pollutants. Pollution worsens air quality and, in many cases, leads to respiratory problems. In addition, carbon-based pollutants are commonly believed to be a contributing factor in climate change and global warming.

The last decade has seen progress in development of alternatively-fueled vehicles. Vehicles fueled by, for example, natural gas, present cleaner and cheaper alternatives to traditional gasoline-powered vehicles. In addition, hybrid vehicles, combining a small gasoline-powered engine with a battery backup, have been developed. While these developments certainly amount to improvements in existing technology, the long-term goal of automotive research and development is development of an economical electric-powered vehicle.

Development of electric-powered vehicles present unique challenges to auto manufacturers. For example, electric-powered vehicles typically require a potential difference of approximately 36 to approximately 48 Volts. Most commercially-available electric-powered vehicles generate the required voltage with a large battery array. Such an array can include, for example, between six and nine 12-Volt batteries. The requirement of a large battery array presents a number of design challenges. First, a battery array generates considerable heat that must be dissipated to a heat sink. Second, a battery array must be efficiently sized to fit within space-confined areas of a passenger vehicle. Consequently, any cooling system for the battery array must also be economically sized.

SUMMARY

The present invention relates generally to battery-cooling systems. In one aspect, the present invention relates to a battery-cooling system. The battery-cooling system includes a battery array and a plurality of heat pipes. Each heat pipe includes a low-profile extrusion having a plurality of hollow tubes formed therein. Each heat pipe includes an evaporator portion and a condenser portion. A heat-transfer fluid is disposed within the plurality of hollow tubes. The evaporator portion is disposed between successive batteries within the battery array. The condenser portion is disposed outside of the battery array and exposed to a heat sink.

In another aspect, the present invention relates to a method of cooling a battery array. The method includes providing a plurality of heat pipes. Each heat pipe includes a low-profile extrusion having a plurality of hollow tubes formed therein. Each heat pipe includes an evaporator portion and a condenser portion. The method further includes placing the evaporator portion between successive batteries within the battery array and arranging the evaporator portion to maximize thermal exposure of the evaporator portion to the successive batteries. The method further includes conducting heat into the evaporator portion from the battery array and discharging the heat from the condenser portion to a heat sink.

BRIEF DESCRIPTION OF THE DRAWINGS

For a more complete understanding of the present invention and for further objects and advantages thereof, reference may now be had to the following description taken in conjunction with the accompanying drawings in which:

FIG. 1 is a perspective view of a battery-cooling system according to an exemplary embodiment;

DETAILED DESCRIPTION

Figure 2A:
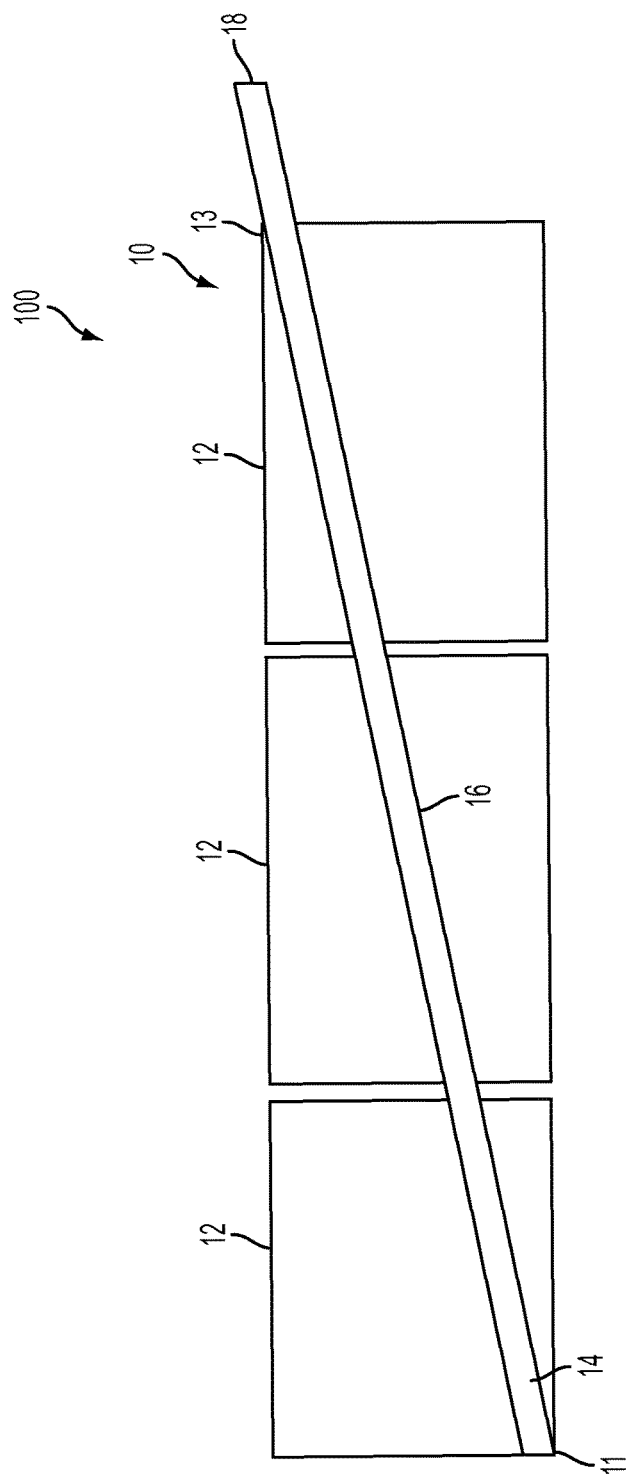
FIG. 2A is a cross-sectional view, taken about section line A-A, of the battery-cooling system of FIG. 1 according to an exemplary embodiment.

Various embodiments of the present invention will now be described more fully with reference to the accompanying drawings. The invention may, however, be embodied in many different forms and should not be construed as limited to the embodiments set forth herein.

As used herein, the term "low-profile extrusion" refers to a heat-exchange apparatus including an integral piece of metal having a plurality of hollow tubes formed therein containing a heat-transfer fluid. In one embodiment, the low-profile extrusion includes multi-void micro-extruded hollow tubes designed to resist corrosion and to operate under pressures and temperatures required by modern environmentally-safe refrigeration gases.

In a typical embodiment, the plurality of hollow tubes are interconnected at their ends so as to allow fluid communication between each tube. Low-profile extrusions are typically formed from heat-conductive materials such as, for example, aluminum. In various alternative embodiments, other heat-conductive materials such as, for example, copper, steel, and other metals or metal alloys may be used. In a typical embodiment, the plurality of hollow tubes have a diameter in a range of about 0.0625 inches to about 0.5 inches, but, in various alternative embodiments, the plurality of hollow tubes may also have significantly smaller diameters.

Low-profile extrusions are typically manufactured with a profile, or height, as low as about 0.05 inches and with the plurality of hollow tubes having varying inner diameters. Future advances may allow low-profile extrusions to be manufactured with smaller profiles. Low-profile extrusions have been used in heat-exchanger applications in the automotive industry and are commercially available in strip form (having a generally rectangular geometry) or coil form (a continuous strip coiled for efficient transport). More detailed disclosure of exemplary low-profile extrusions may be found in U.S. Pat. No. 6,935,409, filed Jun. 8, 1999, U.S. Pat. No. 6,988,315, filed Dec. 23, 2002, and U.S. Pat. No. 7,802,436, filed Jan. 20, 2006 each of which is incorporated herein by reference.

FIG. 1 is a perspective view of a battery-cooling system according to an exemplary embodiment. A battery-cooling system 100 includes a battery array 10 having a plurality of batteries 12 and a plurality of heat pipes 14. For exemplary purposes, the battery array 10 is illustrated as being a 3×3 array; however, one skilled in the art will recognize that any size array could be utilized. In a typical embodiment, the plurality of batteries 12 may be, for example, 12-Volt Lithium-ion batteries or any other type of battery. In the embodiment shown in FIG. 1, the battery array 10 is structured such that the plurality of batteries 12 are arranged into rows 20 and columns 22. In a typical embodiment, the plurality of heat pipes 14 include low-profile extrusions as described hereinabove.

Still referring to FIG. 1, each heat pipe of the plurality of heat pipes 14 includes an evaporator portion 16 and a condenser portion 18. The evaporator portion 16 is disposed between adjacent batteries of the plurality of batteries 12. In an exemplary embodiment, the evaporator portion 16 is disposed between successive rows 20 of the plurality of batteries 12. In the embodiment shown in FIG. 1, the plurality of heat pipes 14 are arranged in an angular pattern between the rows 20. The condenser portion 18 of the plurality of heat pipes 14 extends beyond the battery array 10 and is thermally exposed to a heat sink 210 (shown in FIG. 2B). Extension of the condenser portion 18 beyond the battery array 10 allows discharge of heat from the battery array 10. As illustrated in FIG. 1, in various embodiments, the plurality of heat pipes 14 may be arranged to span a distance between a lower left corner 11 of a left-most battery of the plurality of batteries 12 and an upper right corner 13 of a right-most battery of the plurality of batteries 12. Angular arrangement of the plurality of heat pipes 14 provides several advantages during operation of the battery-cooling system 100. First, angular arrangement of the plurality of heat pipes 14 allows increased surface contact between the evaporator portion 16 and the plurality of batteries 12 thereby maximizing thermal exposure between the plurality of batteries 12 and the evaporator portion 16. Second, angular placement of the plurality of heat pipes 14 allows condensed heat-transfer fluid within the plurality of heat pipes 14 to move from the condenser portion 18 to the evaporator portion 16 via gravity thereby eliminating need for a pump. An exemplary heat pipe 14 is the Phaseplane® manufactured and distributed by Thermotek, Inc.

FIG. 2A is a cross-sectional view, taken about section line A-A, of the battery-cooling system of FIG. 1 according to an exemplary embodiment. In FIG. 2A, the plurality of batteries 12 are shown arranged in rows 20. The plurality of heat pipes 14 are shown with the evaporator portion 16 disposed between successive rows 20 and arranged in an angular pattern. The condenser portion 18 of the heat pipe is shown extending beyond the battery array 10. Extension of the condenser portion 18 beyond the battery array 10 allows discharge of heat from the battery array 10.

Figure 2B:
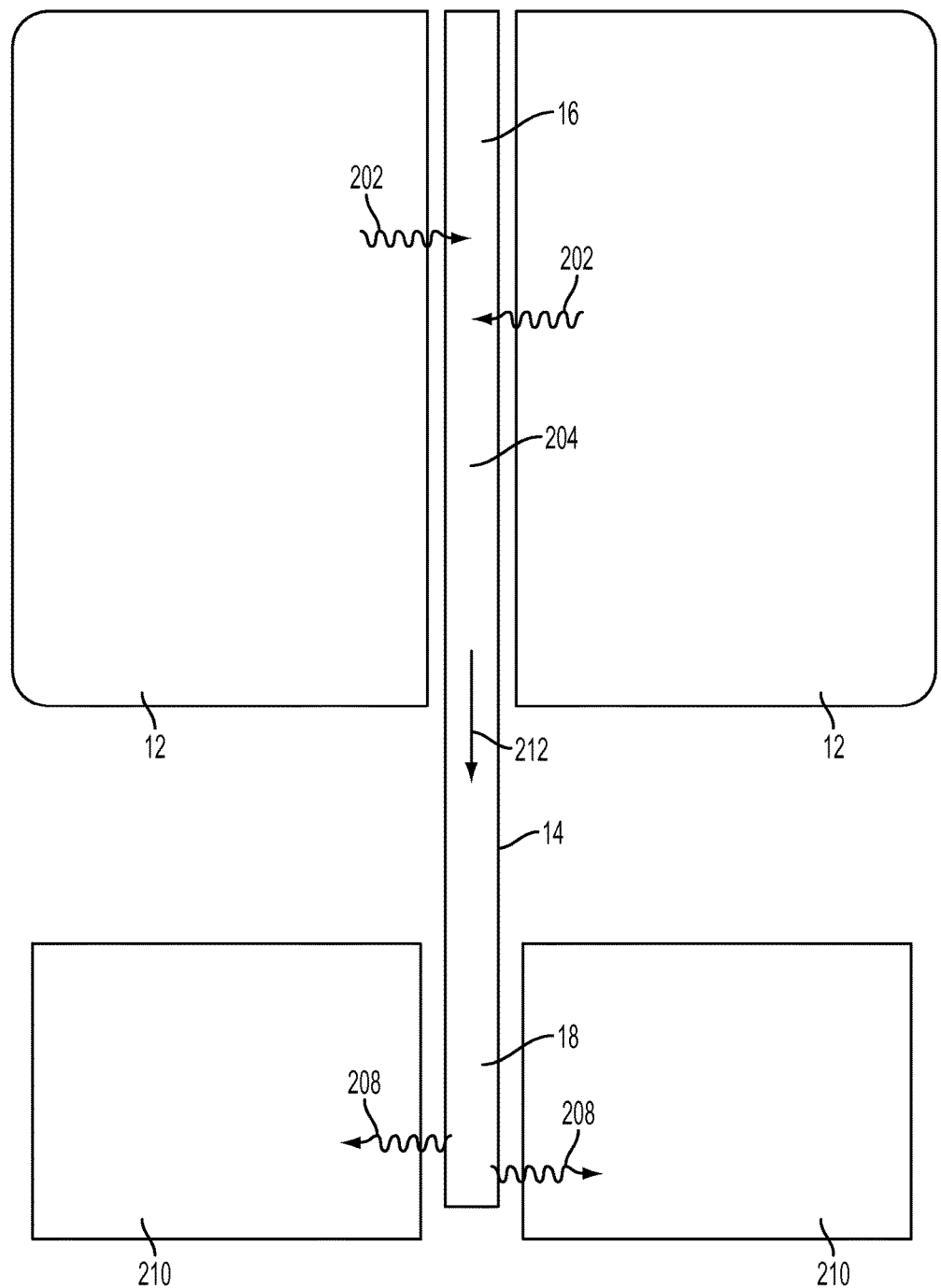
FIG. 2B is a heat-transfer diagram of a battery-cooling system according to an exemplary embodiment.

FIG. 2B is a heat-transfer diagram of the battery-cooling system of FIG. 1 according to an exemplary embodiment. A heat pipe of the plurality of heat pipes 14 is shown disposed between adjacent batteries of the plurality of batteries 12. During operation, heat 202 is generated by the plurality of batteries 12. The heat 202 is conducted into the evaporator portion 16 of the plurality of heat pipes 14 and causes vaporization of a heat-transfer fluid 204 contained in the plurality of heat pipes 14. Heat-transfer fluid vapor migrates to the condenser portion 18 as illustrated by arrow 212. The condenser portion 18 is thermally exposed to a heat sink 210. In various embodiments, the heat sink 210 may be, for example, an exterior environment, a vehicle frame, or a secondary cooling circuit. The heat transfer fluid vapor condenses in the condenser portion 18 thus discharging heat 208 to the heat sink 210.

Figure 3:
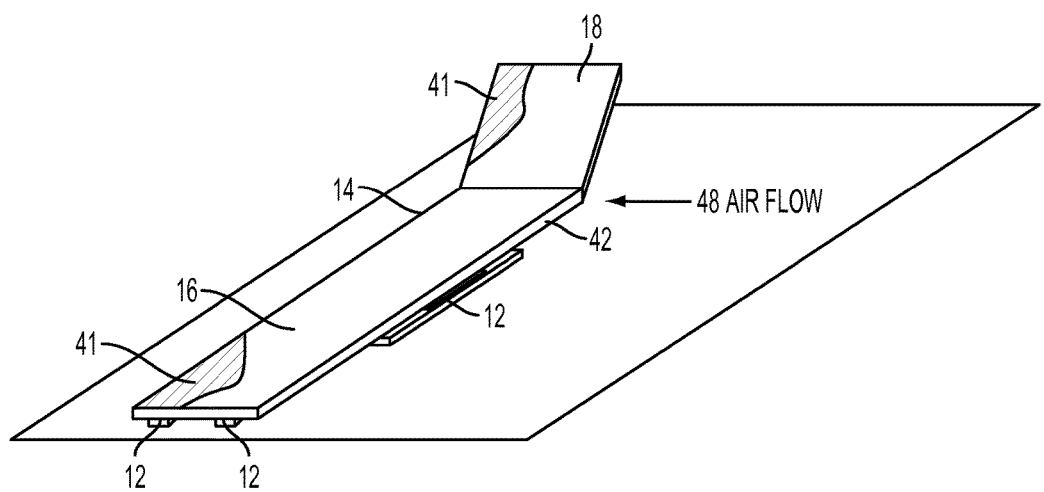
FIG. 3 is a perspective view of a heat pipe according to an exemplary embodiment.

FIG. 3 is a perspective view of a heat pipe according to an exemplary embodiment. The plurality of heat pipes 14 comprise a low-profile extrusion 42. The low-profile extrusion 42 includes a plurality of hollow tubes 41 formed therein. In various embodiments, the low-profile extrusion 42 includes a wick structure (not explicitly shown) inside the plurality of hollow tubes 41. In various embodiments, the wick structure may include, for example, internal fins, grooved inner side walls, or metal screens, so as to maximize heat transfer capability via capillary action.

Still referring to FIG. 3, to form the plurality of heat pipes 14, the plurality of hollow tubes 41 are evacuated. After evacuation, the hollow tubes 41 are charged with a heat-transfer fluid such as, for example, water, glycol, alcohol, or other conventional refrigerant. After charging, ends 41a and 41b of the plurality of hollow tubes 41 are sealed. The plurality of heat pipes 14 generally has an effective thermal conductivity several multiples higher than that of a solid rod. This increase in efficiency is due to the fact that phase-change heat transfer coefficients are high compared to thermal conductivity of conventional materials.

Still referring to FIG. 3, the low-profile extrusion 42 is formed into the evaporator portion 16, for contacting heat-generating components such as, for example, the plurality of batteries 12, and the condenser portion 18. The condenser portion 18 is illustrated by way of example in FIG. 3 as being placed at an angle relative to the evaporator portion 16; however, one skilled in the art will recognize that, in various embodiments, the evaporator portion 16 and the condenser portion 18 may be co-planar.

Referring to FIGS. 1-3, during operation, heat 202 generated by the plurality of batteries 12 is transferred to the heat-transfer fluid 204 in the evaporator portion 16. Heat 202 causes the heat-transfer fluid 204 in the evaporator portion 16 to vaporize within the plurality of hollow tubes 41. The resulting heat-transfer fluid vapor is less dense than surrounding liquid. Thus, the heat-transfer fluid vapor rises within the plurality of hollow tubes 41 into the condenser portion 18. The heat-transfer fluid 204 that is in the liquid phase may also be transferred from the evaporator portion 16 to the condenser portion 18 via capillary action of the wick structures (not explicitly shown). In the condenser portion 18, the heat-transfer fluid vapor condenses into a liquid onto the inner walls of the plurality of hollow tubes 41. The heat 208 released by condensation of the heat-transfer fluid vapor is discharged to the heat sink 210. In an exemplary embodiment, the heat 208 may be transferred to an exterior environment via, for example, air flow 48.

Still referring to FIGS. 1-3, in various embodiments, transfer of the heat 208 to the heat sink 210 can be facilitated utilizing a fan (not explicitly shown) to increase the air flow 48. Further, in various embodiments, at least one fin (not explicitly shown) may be attached to the condenser portion 18 to facilitate transfer of the heat 208 from the condenser portion 18 to the heat sink 210. In other embodiments, a thermoelectric element (not explicitly shown) may be used to facilitate transfer of the heat 208 to the heat sink 210. An exemplary thermoelectric element is shown and described in U.S. patent application Ser. No. 08/327,329 (now U.S. Pat. No. 5,561,981, filed Sep. 16, 1994 and incorporated herein by reference. In still other embodiments, a cooling circuit (not explicitly shown), containing a second heat-transfer fluid (not explicitly shown), may be used to transfer the heat 208 from the condenser portion 18 to the heat sink 210. Finally, in various embodiments, a frame of a vehicle (not explicitly shown) may be used as the heat sink 210.

Figure 4:
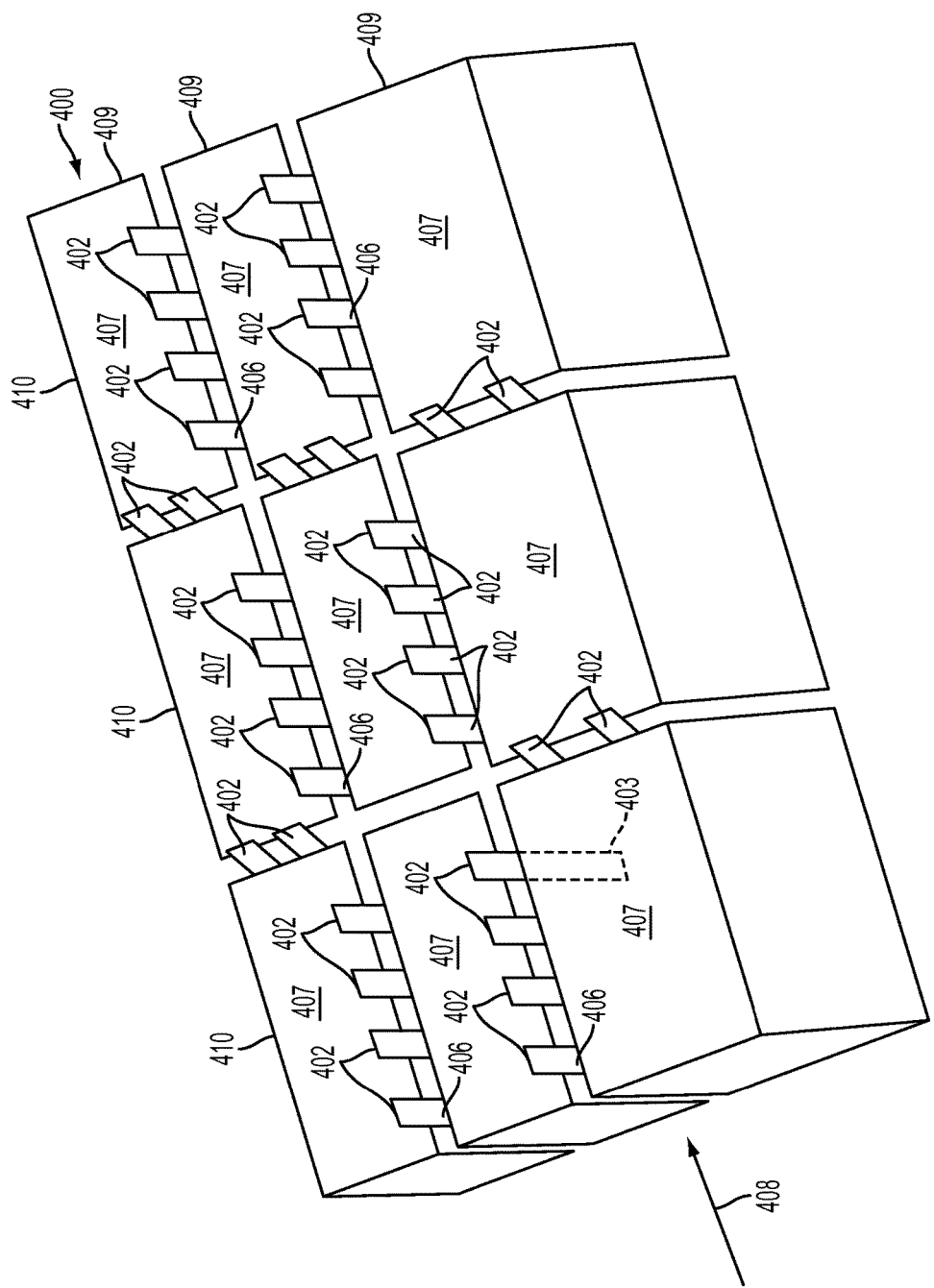
FIG. 4 is a perspective view of a battery-cooling system according to an exemplary embodiment.

FIG. 4 is a perspective view of a battery-cooling system according to an exemplary embodiment. In a typical embodiment, a battery-cooing system 400 includes a battery array 404 having a plurality of batteries 407 arranged in a plurality of rows 409 and a plurality of columns 410. At least one heat pipe 402 is disposed in gaps between successive batteries of the plurality of batteries 407. The at least one heat pipe 402 includes an evaporator portion 403 and a condenser portion 406. The evaporator portion 403 of the at least one heat pipe 402 is disposed between successive batteries 407 within the battery array 404. The at least one heat pipe 402 is depicted by way of example in FIG. 4 as being disposed between successive rows of the plurality of rows 409 and successive columns of the plurality of columns 410; however, one skilled in the art will recognize that the at least one heat pipe 402 may be arranged in any appropriate fashion within the battery array 404. The condenser portion 406 extends above the plurality of batteries 407.

Still referring to FIG. 4, the at least one heat pipe 402 is oriented vertically with respect to the battery array 10. During operation, heat is conducted from the plurality of batteries 407 into the evaporator portion 403 thereby causing a heat-transfer fluid (not explicitly shown) to vaporize as described above with respect to FIG. 3. In a typical embodiment, resulting heat-transfer fluid vapor rises within the at least one heat pipe 402 to the condenser portion 406. In the condenser portion 406, the heat-transfer vapor condenses into a liquid and heat is released to the environment via, for example, air flow 408.

Figure 5:
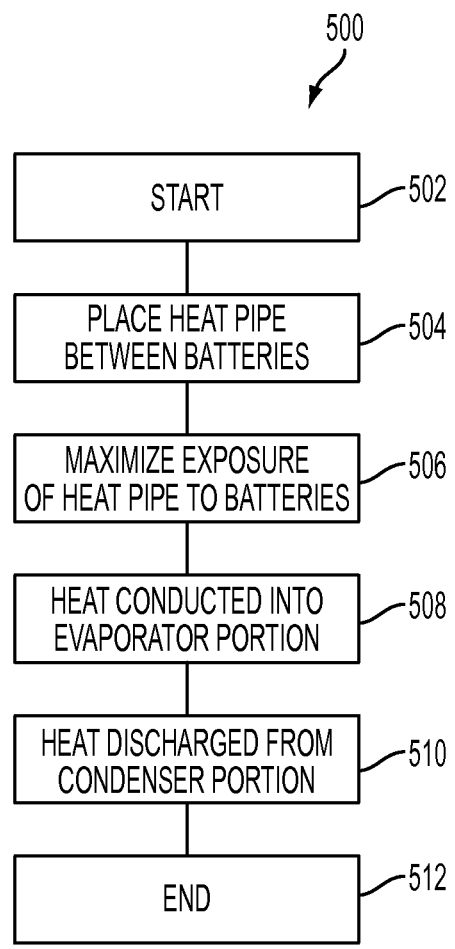
FIG. 5 is a flow diagram of a process for cooling a battery array according to an exemplary embodiment.

FIG. 5 is a flow diagram of a process for cooling a battery array according to an exemplary embodiment. A process 500 begins at step 502. At step 504, a heat pipe 14 is placed between successive batteries 12 of a battery array 10. At step 506, the heat pipe 14 is arranged to maximize thermal exposure of the heat pipe 14 to the battery array 10. At step 508, heat is conducted into an evaporator portion 16 of the heat pipe 14 from the battery array 10. At step 510, the heat is discharged to an exterior environment from the condenser portion 18 of the heat pipe 14. The process 500 ends at step 512.

Although various embodiments of the method and system of the present invention have been illustrated in the accompanying Drawings and described in the foregoing Specification, it will be understood that the invention is not limited to the embodiments disclosed, but is capable of numerous rearrangements, modifications, and substitutions without departing from the spirit and scope of the invention as set forth herein. For example, the heat pipes 14 and 402 have been shown and described herein as having a generally flat profile; however, one skilled in the art will recognize that the heat pipes 14 and 402 could have any profile shape such as, for example, round. It is intended that the Specification and examples be considered as illustrative only.

What is claimed is:

1. A method of cooling a battery array, the method comprising:
   providing a plurality of heat pipes, each heat pipe of the plurality of heat pipes comprising a low-profile extrusion having a plurality of hollow tubes formed within the low-profile extrusion, each heat pipe of the plurality of heat pipes comprising an evaporator portion and a condenser portion;
   placing the evaporator portion between successive batteries within the battery array;
   arranging each heat pipe of the plurality of heat pipes to maximize thermal exposure of the evaporator portion to the successive batteries;
   conducting heat into the evaporator portion of the plurality of heat pipes from the battery array; and
   discharging the heat from the condenser portion of the plurality of heat pipes to a heat sink.

2. The method of claim 1, wherein the arranging comprises placing the evaporator portion at an angle relative to the battery array.

3. The method of claim 1, wherein the discharging comprises discharging the heat to a frame of a vehicle.

4. The method of claim 1, wherein the discharging comprises removing the heat via a cooling circuit.

5. The method of claim 4, wherein the cooling circuit comprises a second heat-transfer fluid therein.

6. The method of claim 1, wherein the battery array comprises a plurality of batteries arranged in a plurality of rows and a plurality of columns.

7. The method of claim 6, wherein each battery of the plurality of batteries is a lithium-ion battery.

8. The method of claim 1, wherein the discharging comprises discharging the heat via a plurality of fins coupled to the condenser portion.

9. The method of claim 1, wherein the conducting heat into the evaporator portion comprises vaporizing a heat transfer fluid present in each heat pipe of the plurality of heat pipes.

10. The method of claim 9, comprising transferring the vaporized heat transfer fluid to the condenser portion.

11. The method of claim 1, wherein the discharging heat from the condenser portion comprises condensing a heat transfer fluid present in each heat pipe of the plurality of heat pipes.

\* \* \* \* \*